United States Patent [19]

Hirano et al.

[11] Patent Number: 4,788,584
[45] Date of Patent: Nov. 29, 1988

[54] RF TRANSISTOR PACKAGE WITH CAPACITOR

[75] Inventors: Yutaka Hirano, Atsugi; Masanobu Itoh, Inagi; Akira Izumi, Tokyo; Yoshikazu Dooi, Yokohama, all of Japan

[73] Assignee: Fujitsu Limited, Kawasaki, Japan

[21] Appl. No.: 166,731

[22] Filed: Mar. 2, 1988

Related U.S. Application Data

[63] Continuation of Ser. No. 20,178, Feb. 26, 1987, abandoned, which is a continuation of Ser. No. 549,646, Nov. 8, 1983, abandoned, which is a continuation of Ser. No. 138,280, Apr. 9, 1980, abandoned.

[30] Foreign Application Priority Data

Apr. 12, 1979 [JP] Japan .................................. 54-44490

[51] Int. Cl.⁴ ............................................. H01L 23/48
[52] U.S. Cl. ........................................ 357/81; 357/51; 357/68; 357/74; 357/80

[58] Field of Search ........................ 357/80, 81, 74, 68, 357/71, 51

[56] References Cited

U.S. PATENT DOCUMENTS

| | | | |
|---|---|---|---|
| 4,004,256 | 1/1977 | Duncan | 333/286 |
| 4,172,261 | 10/1979 | Tsuzuki et al. | 357/80 |
| 4,183,041 | 1/1980 | Goel | 357/80 |

Primary Examiner—William D. Larkins
Attorney, Agent, or Firm—Staas & Halsey

[57] ABSTRACT

A semiconductor device comprising a conductive layer; an insulting layer mounted on the conductive layer and having an opening; terminals deposited on the insulating layer; an active semiconductor element mounted on the conductive layer or the insulating layer, and; a capacitor mounted on the conductive layer. In this device, a path between the semiconductor element and the capacitor is very short and the conductive layer serves as a heat sink.

7 Claims, 6 Drawing Sheets

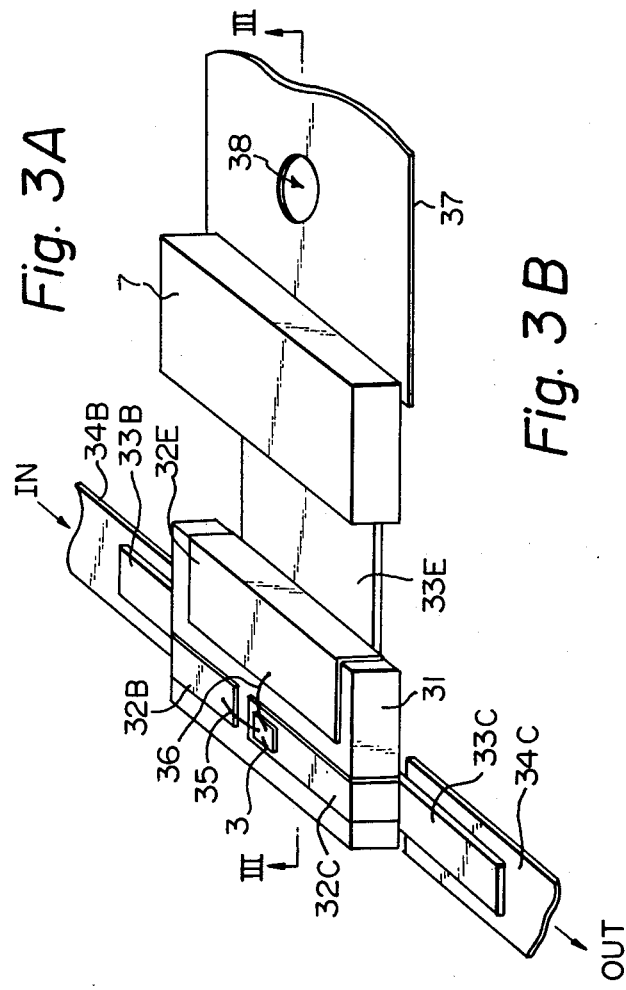
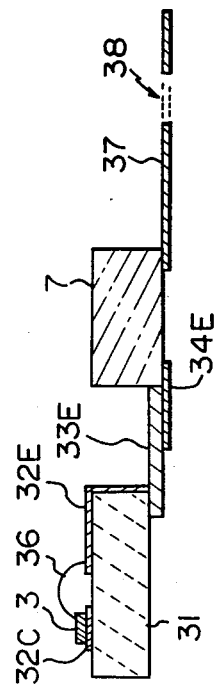
Fig. 3A
Fig. 3B

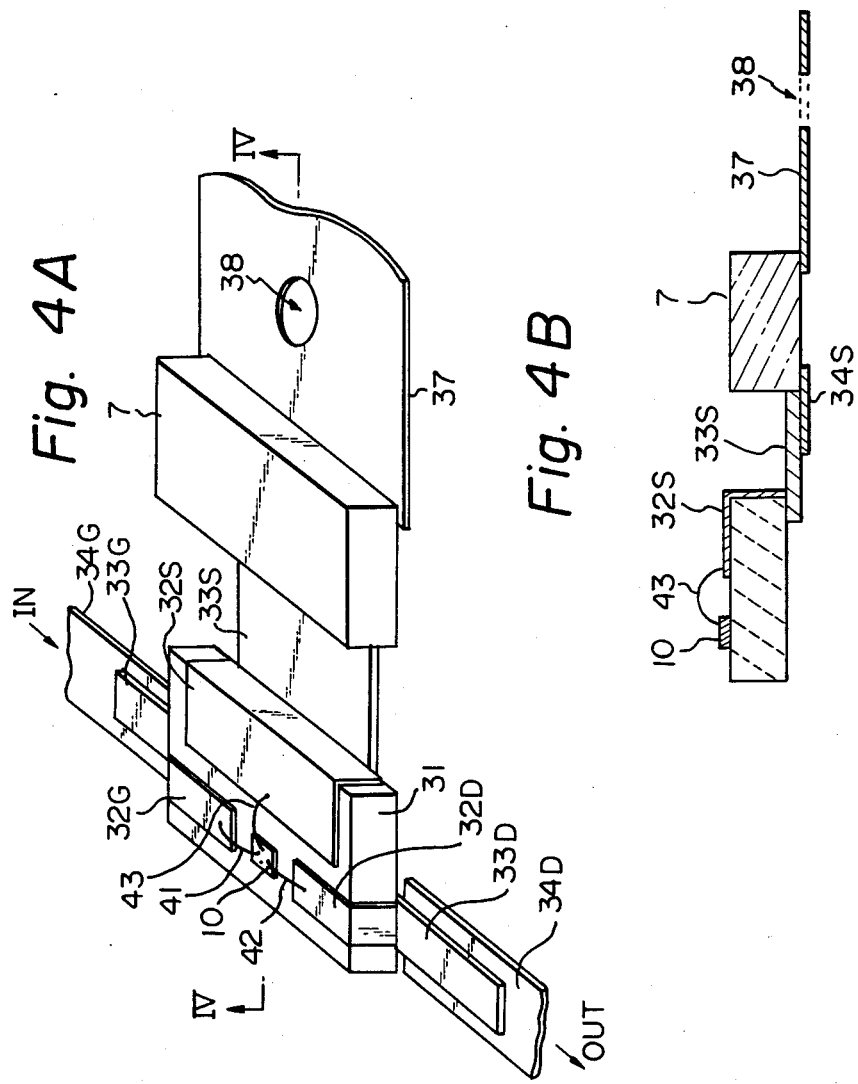

RF TRANSISTOR PACKAGE WITH CAPACITOR

This is a continuation of Ser. No. 07/020,178 filed Feb. 26, 1987, now abandoned, which was a continuation of Ser. No. 06/549,646 filed Nov. 8, 1983, now abandoned, which was a continuation of Ser. No. 06/138,280 filed Apr. 9, 1980, now abandoned.

BACKGROUND OF THE INVENTION (1) Field of the Invention

The present invention relates generally to a semiconductor device and, more particularly, to a semiconductor device used in a high frequency amplifier.

(2) Description of the Prior Art

In recent years, high frequency active semiconductor elements, such as bipolar transistors or GaAs FETs (which is an abbreviation of gallium arsenide field effect transistors), are increasingly employed in a high frequency amplifier, such as a microwave amplifier. Generally, a GaAs FET amplifier requires two direct bias sources, which results in a complex construction of the amplifier. In order to avoid such a complex construction, a self-biased circuitry configuration in which only one direct bias source is necessary and the other bias voltage is automatically provided is widely used. For example, in the case of an amplifier formed by a bipolar transistor, such as an npn-type transistor, a collector and an emitter thereof are connected to ground and a negative bias source, respectively, and a negative base bias voltage is provided automatically by the flow of current through a bias circuit arranged between the collector and the emitter. In this case, a bypass capacitor for providing a low-impedance path for high frequency current is connected between the emitter and ground, so that the amplification characteristics are stable and efficient. On the other hand, in the case of an amplifier formed by a GaAs FET, a drain thereof is connected to a positive bias source, while a source and a gate thereof are connected to the ground through a resistance. As a current flows from the drain to the source and finally to the ground via the resistance, the potential of the source is positive. On the other hand, the potential of the gate is equal to the ground potential. Therefore, a negative voltage is automatically provided between the gate and the source. In this case, a bypass capacitor is also connected between the source and ground, so that the amplification characteristics are stable and efficient.

One conventional amplifier, which is formed on a printed circuit board comprises an active semiconductor element, such as a bipolar transistor or a GaAs FET, a bypass capacitor which is connected to one electrode of the semiconductor element through a metalized thin conductive layer, a terminal plate and other circuits such as matching circuits. However, in such an amplifier, since a path between the active semiconductor element and the capacitor is relatively long, a stray inductance or a parasitic inductance is generated in the path at a high frequency. In this case, the higher is the frequency of the current flowing through the path, the greater is the value of the parasitic inductance thereof. Therefore, in a relatively high frequency range, the impedance between the terminal of the semiconductor element and ground becomes so large that high frequency currents can not sufficiently pass through the bypass capacitor, which results in the amplification characteristics being unstable and degraded. In addition, if the active semiconductor element is of a high power, the element must be provided with a heat sink for dissipating heat, which sink is of a large scale. As a result, it is difficult to arrange a bypass capacitor in the proximity of a high power semiconductor element due to the presence of the large heat sink, which also results in the amplification characteristics being unstable and degraded.

SUMMARY OF THE INVENTION

It is a principal object of the present invention to provide a semiconductor device comprising an active semiconductor element which requires a bypass capacitor for high frequency currents, which device has stable and efficient amplification characteristics when it is used in a high frequency amplifier.

It is another object of the present invention to provide a semiconductor device comprising an active semiconductor element which requires a bypass capacitor for high frequency currents, which device can be used in a high power and high frequency amplifier.

According to the present invention, there is provided a semiconductor device comprising: a conductive layer which is connected to ground; an insulating layer mounted on the conductive layer and having an opening; terminals deposited on the insulating layer; an active semiconductor element, such as a bipolar transistor, mounted on the insulating layer; and a capacitor mounted on the conductive layer and disposed in the opening of the insulating layer, with one electrode of the capacitor connected to the conductive layer and the other electrode of the capacitor connected to one electrode of the active semiconductor element and one of the terminals. By using this semiconductor device in a high frequency amplifier, a path between the semiconductor element and the capacitor is relatively short and, accordingly, a parasitic inductance generated in the path at a high frequency is small, which results in the amplification characteristics being stable and efficient.

According to the present invention, there is also provided a semiconductor device comprising: a conductive layer which is connected to ground; an insulating layer mounted on the conductive layer and having an opening; terminals deposited on the insulating layer; an active semiconductor element, such as a GaAs FET, mounted on the conductive layer through the opening; and a capacitor mounted on the conductive layer and disposed in the opening of the isolating layer, with one electrode of the capacitor connected to the conductive layer and the other electrode of the capacitor connected to one electrode of the active semiconductor element and one of the terminals. By using this semiconductor device in a high frequency amplifier, the amplification characteristics are stable and efficient. In addition, since the conductive layer, which also serves as a heat sink for dissipating heat, is connected directly to the semiconductor element, a high power active semiconductor element can be used as an element of the amplifier.

The present invention will be more clearly understood from the description set forth below with reference to the accompanying drawings.

BRIEF DESCRIPTION OF THE DRAWINGS

FIG. 3A is a perspective view illustrating a conventional semiconductor device comprising, in combination, a bipolar transistor 3 and a capacitor 7 of FIG. 1;

FIG. 3B is a cross-sectional view taken along the line B—B of FIG. 3A;

FIG. 4A is a perspective view illustrating a conventional semiconductor device comprising, in combination, an FET 10 and a capacitor 7 of FIG. 2;

FIG. 4B is a cross-sectional view taken along the line B—B FIG. 4A;

DETAILED DESCRIPTION OF THE PREFERRED EMBODIMENTS

Figure 1:
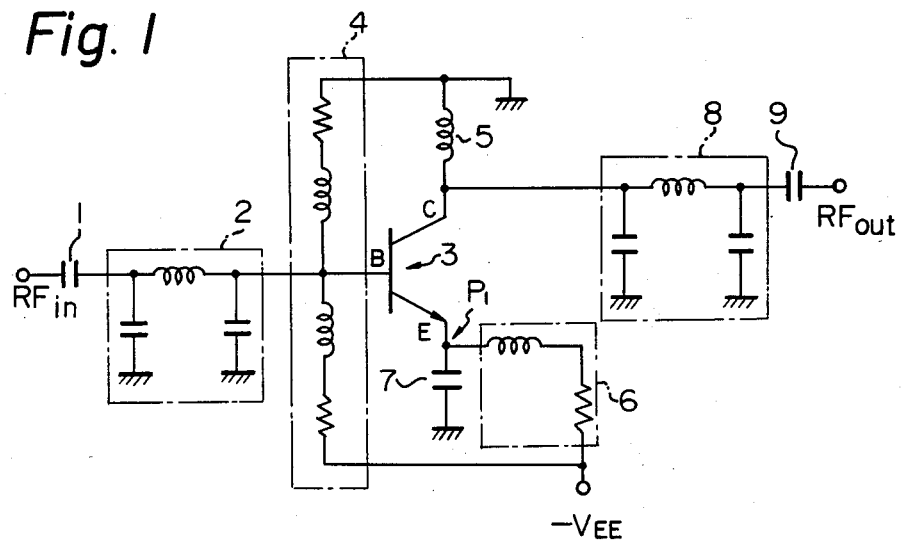
FIG. 1 is a circuit diagram illustrating a conventional high frequency amplifier using a bipolar transistor as an active element.

In FIG. 1, which illustrates a conventional high frequency amplifier using a bipolar transistor as an active element, an input signal $RF_{in}$ is passed through a capacitor 1 in order to block a direct current component of the signal, and an alternating current component of the input signal $RF_{in}$ is supplied to an input matching circuit 2. The output of the input matching circuit 2 is supplied to a base of a bipolar transistor 3 which is, in this case, an npn-type transistor. The bipolar transistor 3 is provided with three bias circuits, i.e., a bias circuit 4 which provides a base bias voltage, a bias circuit 5 which provides a collector bias current and a bias circuit 6 which provides an emitter bias current. In this case, the collector of the transistor 3 is connected to ground, while the emitter thereof is connected to a negative bias source whose voltage is $-V_{EE}$. It should be noted that only one bias source is provided in the amplifier of FIG. 1, which is a so-called self-biased amplifier. A bypass capacitor 7 provides a low-impedance path for high frequency currents. An output signal from the collector of the transistor 3 is stable and efficient. This output signal is supplied through an output matching circuit 8 to a capacitor 9 which blocks a direct current component thereof. An output signal of the capacitor 9 serves as an output signal $RF_{out}$ of the amplifier.

Figure 2:
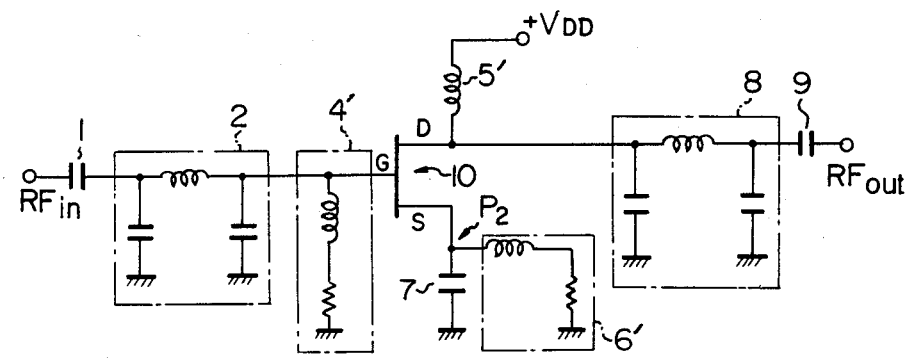
FIG. 2 is a circuit diagram illustrating another conventional high frequency amplifier using an FET as an active element.

FIG. 2 is a circuit diagram illustrating another conventional high frequency amplifier using an FET as an active element. The elements illustrated in FIG. 2 which are identical to those of FIG. 1 are denoted by the same reference numerals. In FIG. 2, as an active element, an FET 10, such as a GaAs FET, which is suitable for high frequencies is used instead of the bipolar transistor 3 (FIG. 1). The FET 10 is also provided with three bias circuits, i.e., a bias circuit 4' which provides a gate bias voltage, a bias circuit 5' which provides a drain bias current and a bias circuit 6' which provides a source bias current. In this case, the drain of the FET 10 is connected to a positive bias source whose voltage is $+V_{DD}$, while the gate and the source of the FET 10 are connected to ground. In the amplifier of FIG. 2, which is also a self-biased amplifier, only one bias source is provided.

In the amplifiers of FIGS. 1 and 2, in order to obtain excellent amplification characteristics, the impedance between the emitter in FIG. 1 (or the source in FIG. 2) and ground must be small.

FIG. 3A is a perspective view illustrating a conventional semiconductor device comprising, in combination, a bipolar transistor 3 and a capacitor 7 of FIG. 1, and FIG. 3B is a cross-sectional view taken along the line B—B of FIG. 3A. In FIGS. 3A and 3B, reference numeral 31 is an insulating substrate, such as a ceramic substrate, on which three metalized thin conductive layers 32B, 32C and 32E are deposited. On the conductive layer 32C, a semiconductor chip, which is the bipolar transistor 3 of FIG. 1, is bonded by soldering. The collector of the transistor 3 is connected to the conductive layer 32C. In addition, the gate and the emitter of the transistor 3 are connected to the conductive layers 32B and 32E, respectively, by bonding wires 35 and 36, respectively. Furthermore, the conductive layers 32B, 32C and 32E are connected to the terminal plates 33B, 33C and 33E, respectively, which are, in turn, bonded to the striplines 34B, 34C and 34E, respectively, deposited on a printed circuit board (not shown). A capacitor 7 which serves as a bypass for high-frequency currents has one electrode connected to the stripline 34E and another electrode connected to a stripline 37, which has a through hole 38 connected to a grounded stripline (not shown). It should be noted that the terminal plate 33E, whose width is almost the same as that of the conductive layer 32E, is kept wide to avoid parasitic inductance. Nevertheless, since a path between the transistor 3 and the capacitor 7 is relatively long, a large parasitic inductance is generated in the path at a high frequency. In other words, in FIG. 1, an impedance between $P_1$ and ground becomes so large that high frequency currents cannot sufficiently pass through the capacitor 7. Therefore, when the semiconductor device of FIGS. 3A and 3B is used in the amplifier of FIG. 1, the amplification characteristics thereof are unstable and degraded.

FIG. 4A is a perspective view illustrating a conventional semiconductor device comprising, in combination, an FET 10 and the capacitor 7 of FIG. 2, and FIG. 4B is a cross-sectional view taken along the line B and B of FIG. 4A. FIGS. 4A and 4B are similar to FIGS. 3A and 3B, respectively, except that, in FIGS. 4A and 4B, a semiconductor chip, which is the FET 10 in FIG. 2, is bonded directly to the insulating substrate 31. However, since a path between the FET 10 and the capacitor 7 is relatively long, a large parasitic inductance is generated in the path at a high frequency. Therefore, when the semiconductor device of FIGS. 4A and 4B is used in the amplifier of FIG. 2, the amplification characteristics thereof are unstable and degraded.

Figure 5A:
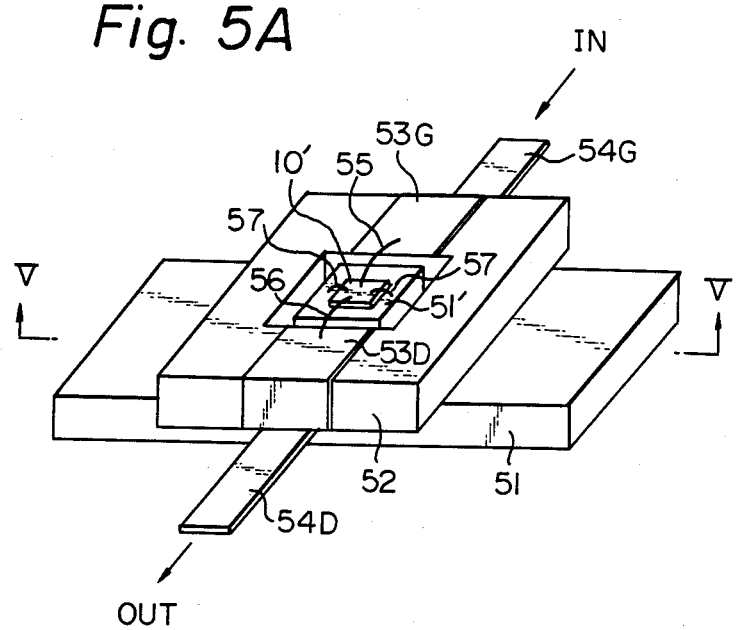
FIG. 5A is a perspective view illustrating a conventional semiconductor device comprising an FET 10 of FIG. 2.
Figure 5B:
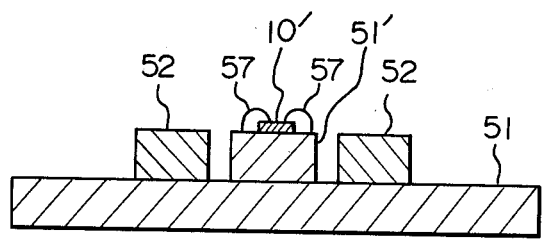
FIG. 5B is a cross-sectional view taken along the line B—B of FIG. 5A.

FIG. 5A is a perspective view illustrating a conventional semiconductor device comprising an FET 10 of FIG. 2 and 5B is a cross-sectional view taken along the line B—B of FIG. 5A. In FIGS. 5A and 5B, a semiconductor chip 10' is a high power FET and, accordingly, the chip 10' requires a heat sink for dissipating heat. As a heat sink, a metal conductive block 51, which is connected to ground, is used. An insulating substrate 52 having a rectangular opening is mounted on the block 51 and, in addition, a rectangular parallelepiped block 51', which is made of the same material as the block 51, is mounted on the block 51 through the opening of the substrate 52. In this case, the thickness of the block 51' is the same as that of the substrate 52. The semiconductor chip 10' is bonded to the block 51'. The source of the chip 10' is connected to the block 51' by wires 57, while the gate and the drain thereof are connected to thin conductive layers 53G and 53D, respectively, which are, in turn, connected to terminal plates 54G and 54D, respectively. However, since the block 51 is very large, it is difficult to arrange a bypass capacitor for high frequency currents in the proximity of the chip 10'. Therefore, when the semiconductor device of FIGS. 5A and 5B is used in the amplifier of FIG. 2, the amplification characteristics thereof are unstable and degraded.

In the present invention, a bypass capacitor is disposed in the proximity of a semiconductor chip and, accordingly, parasitic inductance therebetween is small.

Figure 6A:
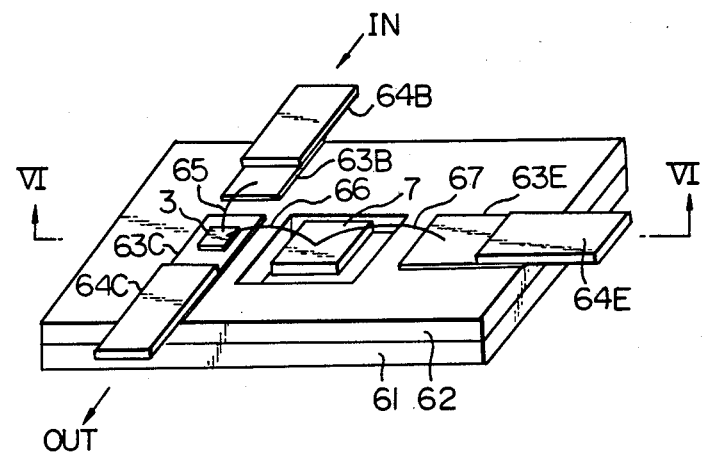
FIG. 6A is a perspective view illustrating a first embodiment of the semiconductor device of the present invention comprising, in combination, a bipolar transistor 3 and a capacitor 7 of FIG. 1.
Figure 6B:
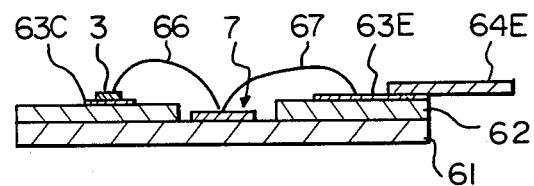
FIG. 6B is a cross-sectional view taken along the line B—B of FIG. 6A.

FIG. 6A is a perspective view illustrating a first embodiment of the semiconductor device of the present invention comprising, in combination, a bipolar transistor 3 and a capacitor 7 of FIG. 1, and FIG. 6B is a cross-sectional view taken along the line B—B of FIG. 6A. In FIGS. 6A and 6B, reference numeral 61 is a conductive layer which can be connected to ground on which is mounted an insulating layer 62, such as a ceramic layer, having an opening whose shape is, for example, rectangular. Three metalized thin conductive layers 63B, 63C and 63E are deposited on the insulating layer 62 and, in addition, three terminal plates 64B, 64C and 64E, which are, for example, made of Kovar, are connected to the conductive layers 63B, 63C and 63E, respectively. A semiconductor chip which is the bipolar transistor 3 is bonded to the conductive layer 63C, while the capacitor 7 is bonded to the conductive layer 61 through the opening of the insulating layer 62. In this case, the collector of the transistor 3 is connected to the conductive layer 63C, while the base thereof is connected to the conductive layer 63B by a wire 65. In addition, the emitter of the transistor 3 is connected to one electrode of the capacitor 7 by a wire 66, which electrode is connected to the conductive layer 63E by a wire 67. The other electrode of the capacitor 7 is connected to the conductive layer 61. Thus, since the capacitor 7 is disposed in the proximity of the transistor 3, in other words, since a path between the transistor 3 and the capacitor 7 is very short, parasitic inductance generated in the path at a high frequency is very small. Therefore, when the semiconductor device of FIGS. 6A and 6B is used in the amplifier of FIG. 1, the amplification characteristics are stable and efficient.

Figure 7A:
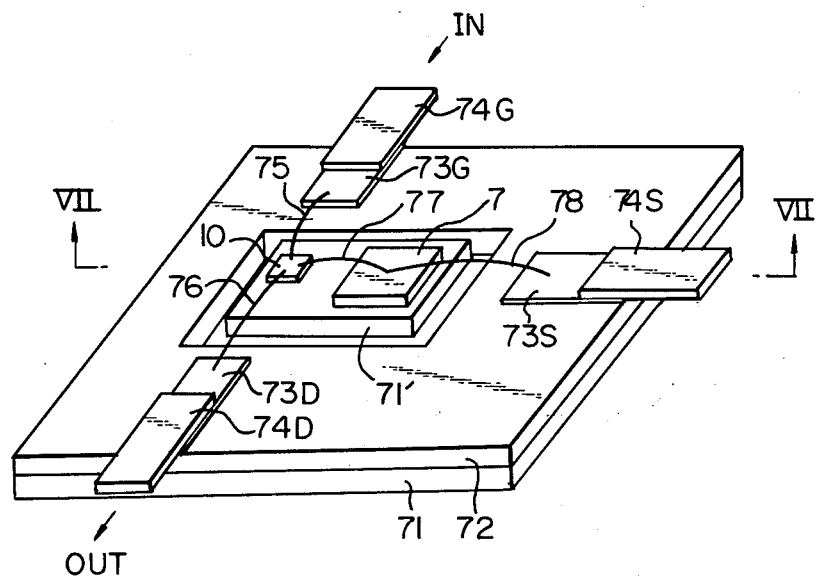
FIG. 7A is a perspective view illustrating a second embodiment of the semiconductor device of the present invention comprising, in combination, an FET 10 and a capacitor 7 of FIG. 2
Figure 7B:
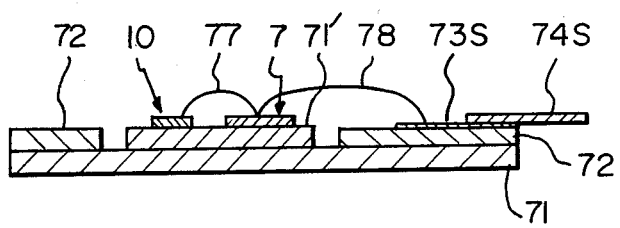
FIG. 7B is a cross-sectional view taken along the line B—B of FIG. 7A.

FIG. 7A is a perspective view illustrating a second embodiment of the semiconductor device comprising, in combination, a FET 10 and a capacitor 7 of FIG. 2, and FIG. 7B is a cross-sectional view taken along the line B—B of FIG. 7B. FIGS. 7A and 7B are similar to FIGS. 6A and 6B, except that a conductive layer 71', which is made of the same material of the conductive layer 71 which can be connected to ground, is mounted on the layer 71'. In addition, both a semiconductor chip, which is the FET 10, and the capacitor 7 are bonded on the conductive layer 71'. Since the capacitor 7 is disposed in the proximity of the FET 10, in other words, since a path between the FET 10 and the capacitor 7 is very short, parasitic inductance generated in the path at a high frequency is very small. Therefore, when the semiconductor device of FIGS. 7A and 7B is used in the amplifier of FIG. 2, the amplification characteristics are stable and efficient. In addition, since the FET 10 is connected directly to the conductive layers 71 and 71', which serve as a heat sink, a high power FET can be used as the FET 10. It should be noted that, although the conductive layer 71', whose thickness is the same as that of the insulating layer 72, permits an easy wire-bonding operation, it can be omitted.

As explained hereinbefore, the semiconductor device according to the present invention has the following advantages as compared with those of the conventional devices.

(1) When the semiconductor device is used in a high frequency amplifier which requires a bypass capacitor for high-frequency currents, the amplification characteristics are stable and efficient, since parasitic inductance between the active element, such as a bipolar transistor or an FET, and the capacitor is very small, in other words, a low-impedance is maintained therebetween.

(2) The semiconductor device can be adapted to a high power active semiconductor element, since the semiconductor elements can be connected directly to a heat sink.

We claim:

1. A high frequency semiconductor amplifier requiring a bypass capacitance for high frequency currents and a heat sink for high power operation, comprising:
a first, heat sink conductive layer having a main surface and having an electrical ground connection;
an insulating layer of a first predetermined thickness formed on the main surface of the heat sink conductive layer and having a generally, centrally located opening therein exposing therethrough a corresponding portion of the main surface of the heat sink conductive layer;
a second conductive layer formed on the exposed portion of the main surface of the first, heat sink conductive layer and of a second predetermined thickness;
an active semiconductor element, comprising a field effect transistor having source, gate and drain regions and corresponding connection points, mounted on and bonded to the second conductive layer and of a third predetermined thickness;
a bypass capacitor having top and bottom electrodes and of a fourth predetermined thickness, mounuted on and bonded to the second conductive layer in closely spaced relationship to the semiconductor element and defining a first alignment direction relatively to the semiconductor element and the opening in the insulting layer, the bottom electrode of the bypass capacitor being electrically connected to the second conductive layer, the first heat sink conductive layer and the electrical ground connection;
each of the third and fourth predetermined thickness of the active semiconductor element and the bypass capacitor, respectively, being substantially less than either of the first and second predetermined thickness of the first, heat sink conductive layer and the insulating layer, respectively;
a first metallized layer formed on the insulating layer and aligned in the first alignment direction, with the bypass capacitor positioned between the first metallized layer and the semiconductor element;
means for providing a series electrical connection of the source connection point of the semiconductor element, the top electrode of the bypass capacitor, and the first metallized layer;

second and third metallized layers formed on the insulating layer in a second alignment direction, transverse to the first alignment direction, and aligned with and spaced apart from the semiconductor element by at least the opening in the insulating layer;

means for providing an electrical connection between the drain connection point of the semiconductor element and the second metallized layer;

means for providing an electrical connection between the gate connection point of the semiconductor element and the third metallized layer; and a source terminal plate oriented in the first alignment direction and bonded to the first metallized layer, and drain and gate terminal plates oriented in the second alignment direction and respectively bonded to the second and third metallized layers, the source, drain and gate terminal plates extending laterally from the first heat sink conductive layer and the insulating layer to provide external electrical connections to the amplifier.

2. A high frequency semiconductor amplifier as recited in claim 1, wherein:

the gate terminal plate comprises an input terminal for receiving high frequency input signals and the drain terminal plate comprises an output terminal for the amplified, high frequency output signals of the amplifier; and said means for connecting the source connection point and the top electrode of the bypass capacitor, and for connecting the top electrode of the bypass capacitor and the first metallized layer comprise respective, first and second wires, the first wire and the bypass capacitor providing a low impedance path to the electrical ground connection for high frequency currents from the source region of the active semiconductor element and thereby stabilizing the amplification of the amplifier with respect to the received high frequency input signals and the amplified, high frequency output signals.

3. A high frequency semiconductor amplifier as recited in claim 1, wherein:

the first and second predermined thickness of the insulating layer and the second conductive layer are substantially the same, and the second and third predetermined thickness of the active semiconductor element and the bypass capacitor, respectively, are substantially the same and substantially less than either of the first and second predetermined thicknesses, such that the respective upper surfaces of the active semiconductor element, the bypass capacitor, and the insulating layer are substantially in a common plane.

4. The device of claim 2, wherein the parasitic inductance for propagation of said high frequency current between the source and said top electrode of the capacitor is effecitvely limited by the length of the first connecting wire in comparison to the length and respective parasitic inductance of said second wire.

5. The device of cliam 2, wherein the parasitic inductance for propagation of said high frequency current between the source and said top electrode of the capacitor is effectively limited by the length of the first connecting wire in comparison to the length and respective parasitic inductance of said second wire.

6. The device of claim 2, wherein the parasitic inductance for propagation of said high frequency current between the source and said top electrode of the capacitor is effectively limited by the length of the first connecting wire in comparison to the length and respective parasitic inductance of said second wire.

7. The device of claim 6, said first and second conducting layers serving as a heat sink for the active semiconductor element.

* * * * *

UNITED STATES PATENT AND TRADEMARK OFFICE
CERTIFICATE OF CORRECTION

PATENT NO. : 4,788,584

DATED : November 29, 1988

INVENTOR(S) : HIRANO et al.

It is certified that error appears in the above-identified patent and that said Letters Patent is hereby corrected as shown below:

Col. 3, line 25, change "2 and" to --2; and--.

Col. 4, line 61, change "5B" to --FIG. 5B--.

Col. 5, line 61, change "71'." to --71.--.

Col. 6, lines 57 and 61, change "thickness" to --thicknesses--.

Col. 8, line 6, change "predermined thickness" to --predetermined thicknesses--;

line 9, change "thickness" to --thicknesses--;

line 24, change "cliam" to --claim--.

Signed and Sealed this

Eighteenth Day of April, 1989

Attest:

DONALD J. QUIGG

*Attesting Officer*    Commissioner of Patents and Trademarks